United States Patent [19]
Konishi

[11] Patent Number: 5,168,248
[45] Date of Patent: Dec. 1, 1992

[54] FERRI-MAGNETIC FILM FREQUENCY MODULATOR

[75] Inventor: Yoshihiro Konishi, Sagamihara, Japan

[73] Assignee: Uniden Corporation, Chiba City, Japan

[21] Appl. No.: 832,583

[22] Filed: Feb. 7, 1992

[51] Int. Cl.$^5$ .......................... H03C 3/02; H03C 3/06
[52] U.S. Cl. ....................... 332/123; 332/129; 332/130; 332/135; 455/42; 455/111
[58] Field of Search .............. 332/117, 123, 126, 129, 332/130, 135; 455/42, 110, 111

[56] References Cited

U.S. PATENT DOCUMENTS

| | | | |
|---|---|---|---|
| 3,036,277 | 5/1962 | Gindsberg | 332/129 X |
| 3,328,712 | 6/1967 | Stimler | 332/129 X |
| 4,188,594 | 2/1980 | Bongianni | 332/129 |

Primary Examiner—Siegfried H. Grimm
Attorney, Agent, or Firm—Stevens, Davis, Miller & Mosher

[57] ABSTRACT

For realizing a highly sensitive and favorably linear frequency modulator stably operating with a small-sized and readily manufactured arrangement, input and output strip electrodes are disposed in face on both ends of a ferri-magnetic film deposited on a magnetic substrate and applied with a DC magnetic field perpendicular thereto, a high frequency electro-magnetic wave being applied through the input electrode, so as to generate a magneto-static forward volume wave propagating through the magnetic film, the propagation phase of which is modulated in response to the intensity variation of the applied magnetic field modulated by a signal, so as to derive a frequency modulated electro-magnetic wave from the output electrode.

12 Claims, 11 Drawing Sheets

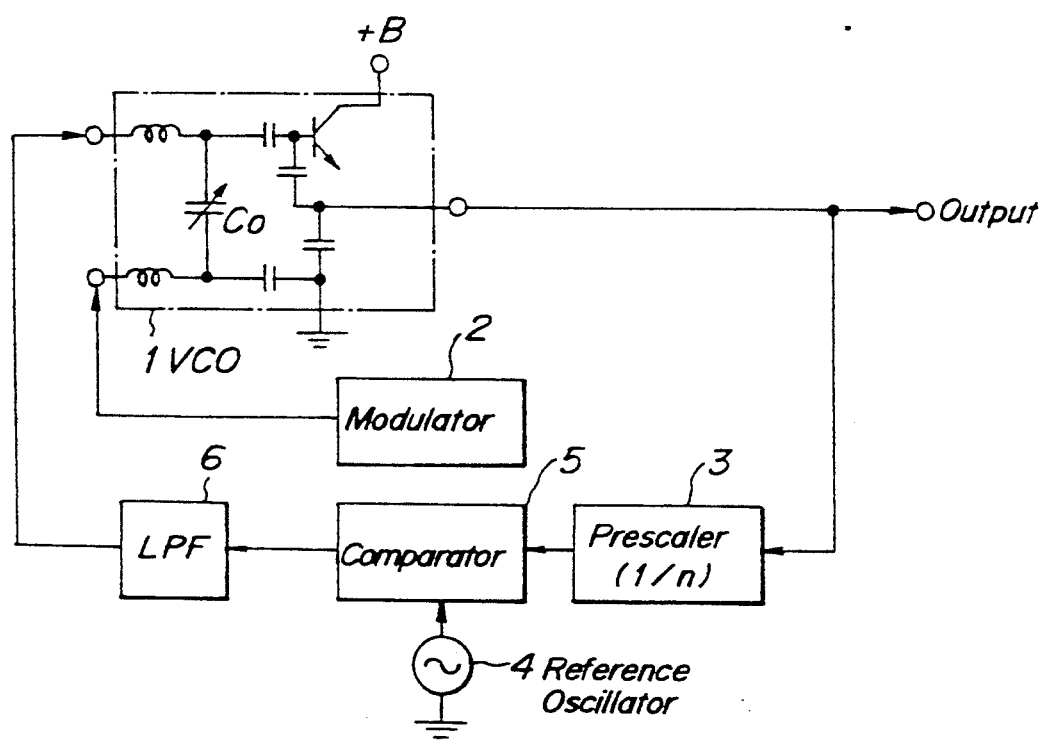
FIG_1
PRIOR ART

FIG_2A
PRIOR ART
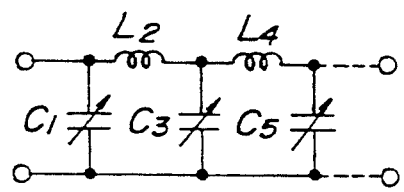
FIG_2B
PRIOR ART
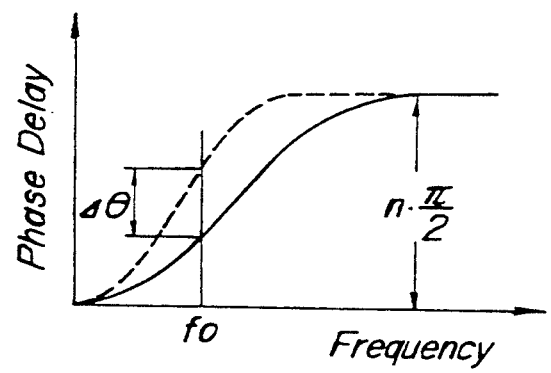

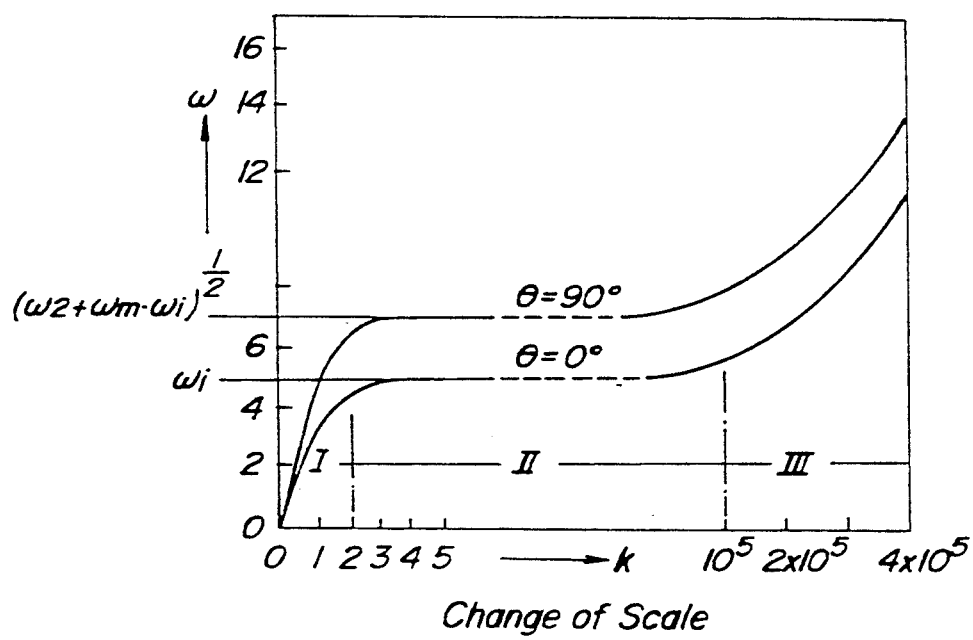
FIG_3

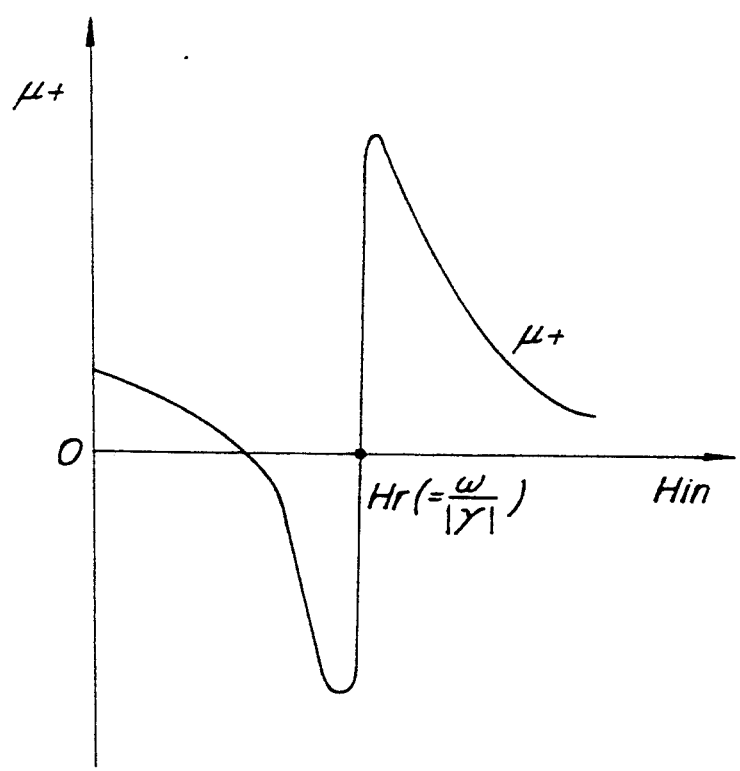
FIG_4

FIG_5A
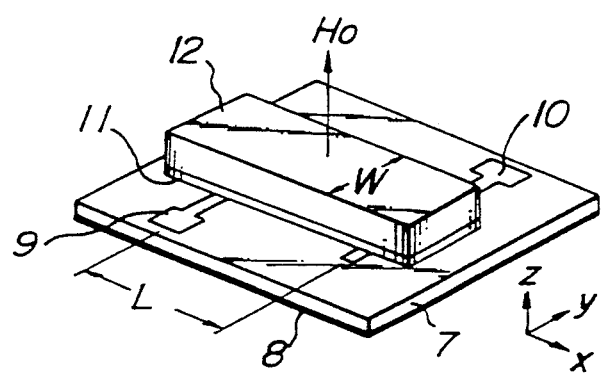
FIG_5B
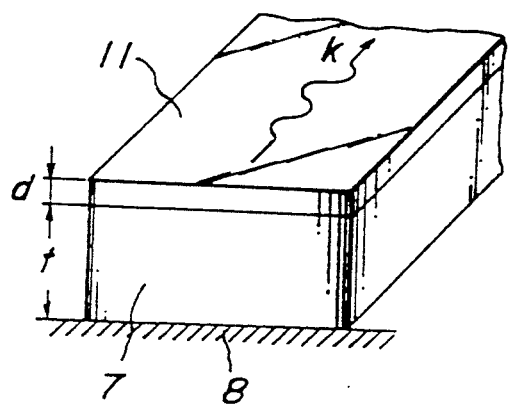

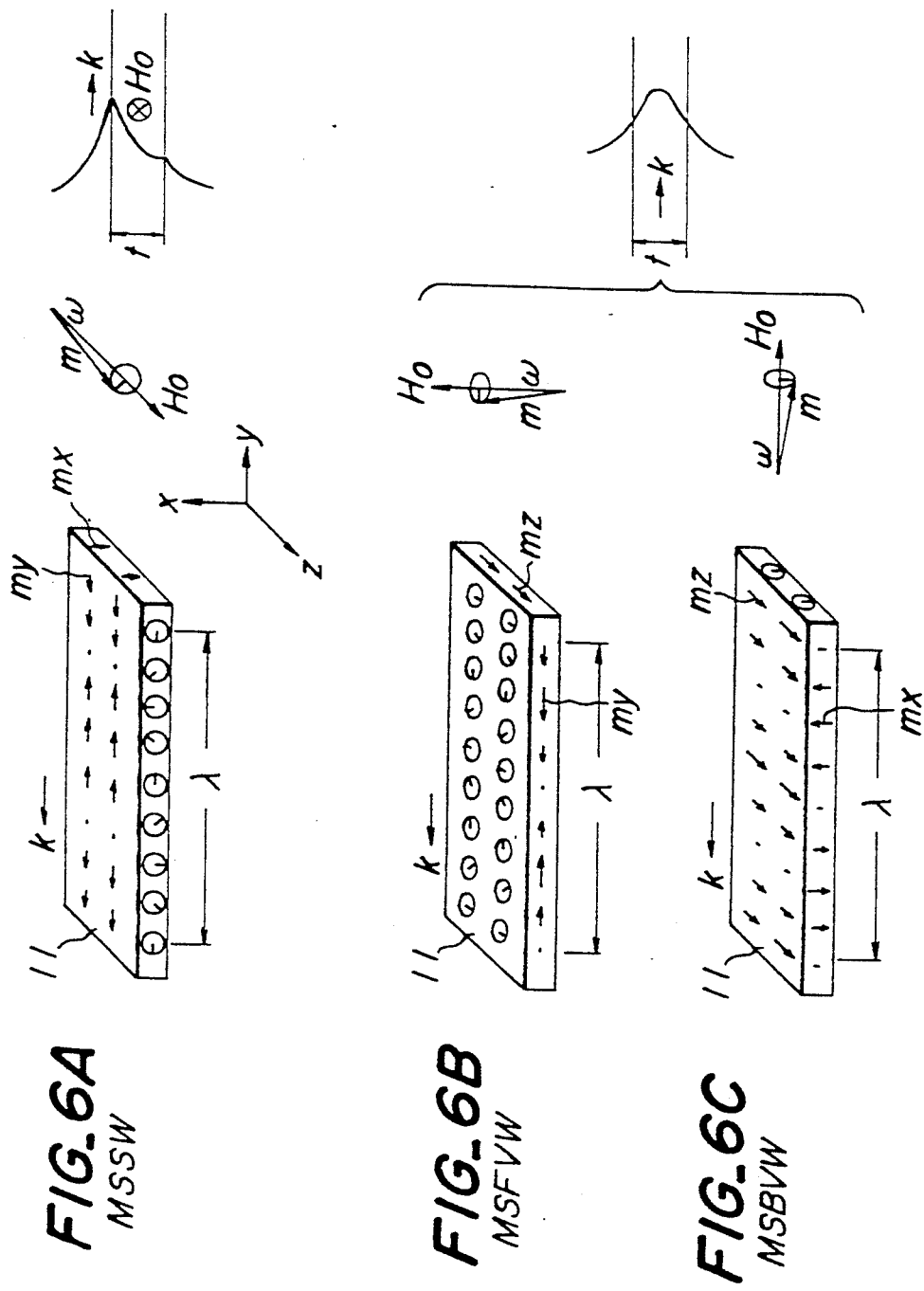
FIG. 6A MSSW
FIG. 6B MSFVW
FIG. 6C MSBVW

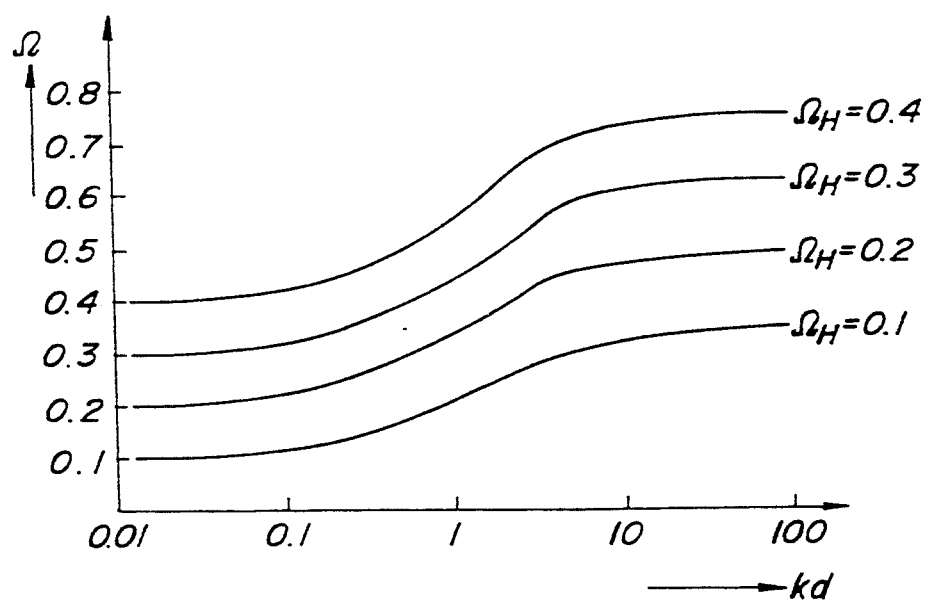
FIG_7

FIG_8
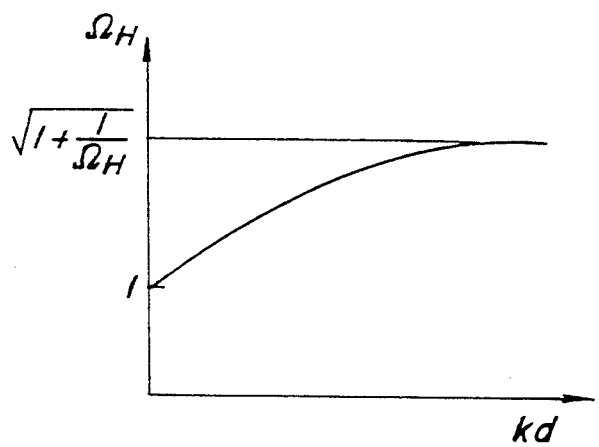
FIG_9
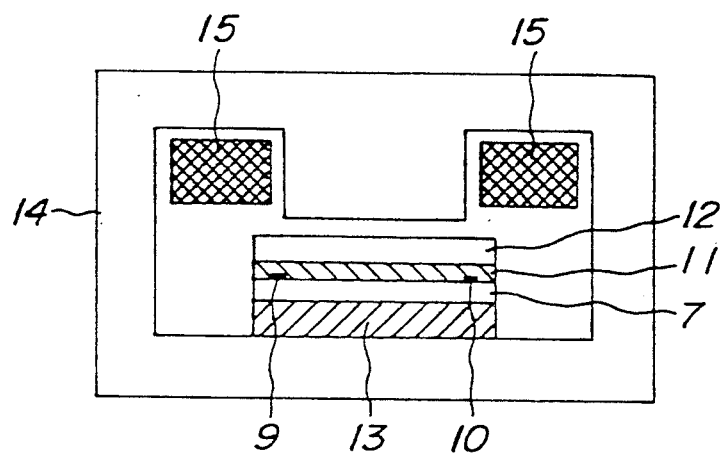

FIG_10
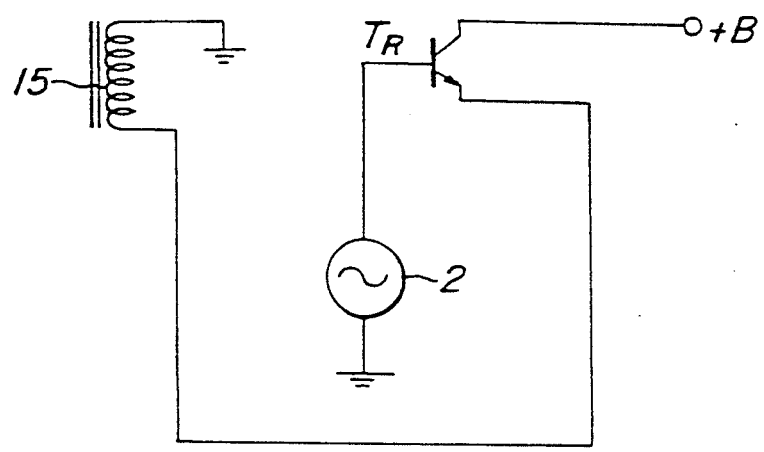
FIG_11
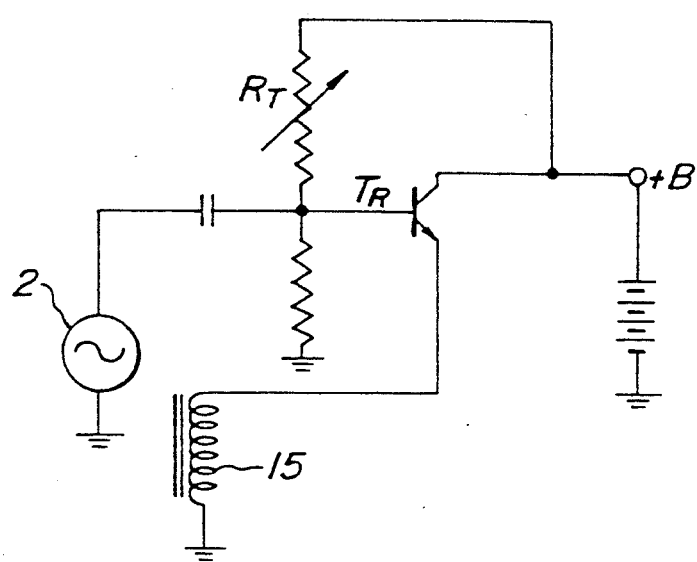

FIG_12A
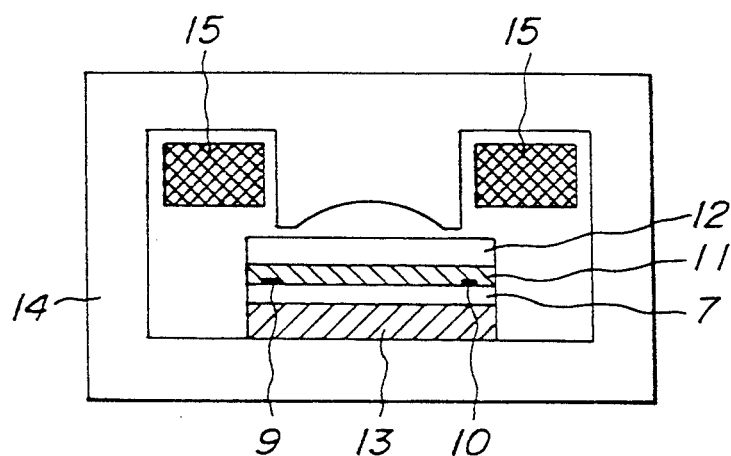
FIG_12B
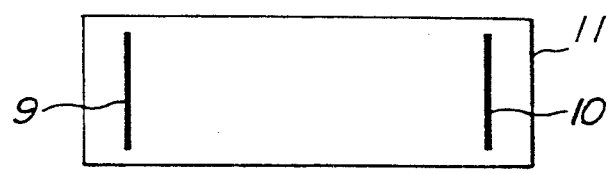

FERRI-MAGNETIC FILM FREQUENCY MODULATOR

BACKGROUND OF THE INVENTION

1. Field of the Invention

The present invention relates to a frequency modulator utilizing a magneto-static wave for obtaining a frequency-modulated output high frequency electro-magnetic wave by varying a propagation velocity of the magneto-static wave through the modulation of an applied DC magnetic field, which magneto-static wave is generated in a ferri-magnetic member applied with said DC magnetic field through the mutual conversion from the high frequency electro-magnetic wave, particularly, to a ferri-magnetic film frequency modulator having a good linearity through a small-sized and readily manufactured arrangement of a ferri-magnetic film, so as to be stably operated with a high sensitivity.

2. Related Art Statement

Among conventional frequency modulators of various circuit systems, those which utilize a voltage-controlled oscillator (VCO) and a varactor respectively are typical.

In the frequency modulator utilizing the VCO, as shown in FIG. 1, a part of high frequency output of the VCO1 is supplied to a prescaler for dividing the frequency thereof by 1/n, so as to be phase-compared with an output oscillation of a reference oscillator 4 in a comparator 5, a resultant DC voltage being applied on a resonant circuit containing a varactor $C_0$ in the VCO1 for fixing the oscillation frequency thereof at the reference, and a modulation signal voltage from a modulator 2 being superposed thereon for the frequency modulation.

However, the conventional frequency modulator arranged as mentioned above has a defect that a low-pass filter 6 is necessitated for applying the resultant DC voltage on the VCO1 and hence it is difficult to attain the frequency modulation effected by the low frequency modulation signal.

On the other hand, in the frequency modulator effecting the phase modulation through a multi-stage filter employing varactors, as shown in FIG. 2A, the phase through the low pass filter (LPF) of n stages consisting of varactors $C_1$, $C_3$, $C_5$, ... and inductors $L_2$, $L_4$, ... is delayed by $n\pi/2$ radian. When capacities of those varactors are varied, the cutoff frequency of the LPF is varied. For instance, when those capacities are increased, the phase characteristic curve as shown by a solid line in FIG. 2B is varied as shown by a dotted line, and, as the result, the phase $\theta$ at the frequency $f_o$ is varied by $\Delta\theta$.

Meanwhile, when the signal which is phase-modulated as mentioned above is denoted by $V_{PM}$, the signal $V_{PM}$ can be expressed by the following equation (1).

$$V_{PM} = A\cos\{2\pi f_c t + V_{(t)} - \theta_o\} \tag{1}$$

And hence, the instant angular frequency of the frequency-modulated signal can be expressed by time-differentiating the portion bracketed in $\{\}$ of the equation (1) as follows.

$$2\pi f_c + \frac{dV_{(t)}}{dt}$$

When the following equation (2) is given with regard to the modulation of frequency $f_m$ and the maximum phase delay $\theta_{max}$, $$V_{(t)} = \theta_{max}\sin(2\pi f_m t) \tag{2}$$

the instant angular frequency can be expressed as follows.

$$2\pi\{f_c + \theta_{max} f_m \cos(2\pi f_m t)\}$$

Furthermore, the maximum frequency deviation denoted by $\Delta f$ can be expressed as follows.

$$\Delta f = \theta_{max} \cdot f_m$$

and hence $$\theta_{max} = \frac{\Delta f}{f_m} \tag{3}$$

In this connection, this equation (3) is well-known and is called a "modulation index".

Accordingly, when the modulation frequency $f_m$ and the frequency deviation $\Delta f$ are given, the frequency modulation can be effected by varying the voltage applied on the varactors in the LPF as shown in FIG. 2A until the equation $\Delta\theta = \theta_m$ is attained.

However, the lower the modulation frequency $f_m$ is lowered, the more the phase variation $\Delta\theta$ is increased, and hence it is required the more to vary the voltage applied on the varactors, as is apparent from the equation (3).

Consequently, the conventional frequency modulator arranged as mentioned above has a defect that the nonlinear distortion is resulted from the property of the varactor.

In place of these conventional frequency modulators respectively having the defects as mentioned above, a different frequency modulator in which the frequency modulation is effected by varying the propagation phase of a wave has been conventionally developed.

When a situation such that n waves are propagating successively on a line having a length L is supposed, the wave length $\mu$ of those waves is expressed by the following equation (4).

$$\lambda = \frac{L}{n} \tag{4}$$

When this wave length $\lambda$ is varied by $\eta\lambda$ through any means, the phase variation $\Delta\theta$ on the line having the length L can be expressed by the following equation (5).

$$\Delta\theta = 2\pi \cdot \eta \cdot n = 2\pi\eta \cdot \frac{L}{\lambda} \tag{5}$$

In this regard, for providing the frequency modulator arranged as mentioned above in a small size, it is required to reduce the line length L, while it is preferred to reduce the factor $\eta$ for improving the linearity also.

On the other hand, as described before, the lower the modulation frequency $f_m$ is lowered, the more phase variation $\Delta\theta$ is required to be, so that it is required according to the equation (5) that the wave length $\lambda$ is reduced.

For example, in the case that the maximum frequency deviation $\Delta f = 5$ kHz, it is required according to the equation (3), to attain the following phase variation $\Delta \theta$.

$$\Delta \theta = \theta \max = \frac{5,000}{150} = 33.33 \text{(radian)}$$

In the case that L=3 mm and $\eta = 0.1$, the following wave length $\lambda$ is obtained according to the equation (5).

$$\lambda = \frac{2\pi \eta L}{\Delta \theta} = \frac{2\pi \times 0.1 \times 3(\text{mm})}{33.33 \ldots} = 0.05655 \text{ mm} = 56.55 \ \mu m \quad (6)$$

As for the wave propagating on the line with the short wavelength as mentioned above, (a) an elastic wave and (b) a magnetic wave can be regarded. However, for the elastic wave (a), it is difficult to vary the wavelength by externally applying an electric field or a magnetic field on the propagation line, so that it is extremely difficult to realize the frequency modulator arranged as mentioned above by employing the elastic wave. Consequently, that which can be expected to be realized is the frequency modulator arranged as mentioned above by employing the magnetic wave (b).

In this connection, the magnetic wave can be generally regarded as the wave which propagates through a ferri-magnetic member applied with a DC magnetic field, and, when the vector of the applied magnetic field is denoted by H, it can be regarded as the wave such that the energy of the electric field, which satisfies the condition as expressed by the following equation ($\eta$), is substantially zero.

$$\nabla \times H \doteq 0 \quad (7)$$

For instance, the relation between the angular frequency $f$ of the wave which propagates through the ferri-magnetic member having an infinite region and the number k of those waves contained in the unit length 1 cm can be expressed as shown in FIG. 3. In FIG. 3, $\theta$ indicates an angle between the direction of the applied DC magnetic field and the propagation direction f the wave, while the wave consists of an electro-magnetic wave in the region I, of a magneto-static wave in the region II and of that which is called as an exchanged spin wave in the region III.

Among the waves of these three kinds, with regard to the exchanged spin wave in the region III, the number of waves contained in the unit length is large, and hence the wave length is short. For example, when the wave number $k = 10^5$ in FIG. 3, the wave length $\lambda$ becomes as follows.

$$\lambda = \frac{10,000(\mu m)}{10^5} = 0.1 \ \mu m$$

On the other hand, as described later with regard to the frequency modulator of this kind, the size of the electrodes employed for the conversion between the electro-magnetic wave and the magneto-static wave is required to have a precision of the same order as the wavelength of those waves. So that, in the case that the wavelength $\lambda$ is too short, it is difficult to realize the frequency modulator of this kind. In this regard, the wavelength of the magneto-static wave in the region II as shown in FIG. 3 is in order of several tens $\mu m$, so that a sufficiently short wavelength $\lambda$ can be obtained in the realizable range. Consequently, the magneto-static wave is the most suitable for obtaining the wavelength such as expressed by the equation (6).

In this connection, FIG. 3 relates to the propagation medium having an infinite region, while in the situation of the finite region, for instance, such that the DC magnetic field is applied in the axial direction of a fine cylindrical ferri-magnetic body, the magneto-static wave propagation in the axial direction is generated, and the phase velocity thereof can be expressed by the following equation (8).

$$\left. \begin{array}{l} v_p = 3.7 \dfrac{R}{\lambda_c} v'_p \\ \lambda_c = \dfrac{v_o}{\sqrt{\epsilon_r}} \\ v'_p = \dfrac{v_o}{\sqrt{\epsilon_r |\mu_{+,r}|}} \end{array} \right\} \quad (8)$$

where, R is a radius of the cylindrical ferri-magnetic body:
- $v_o$ is the velocity of an electro-magnetic wave in vacuum;
- $\epsilon_r$ is a specific permittivity of the ferri-magnetic body; and
- $\mu_{+,r}$ is a positive circular-polarized specific permeability, the value of which is abruptly varied at the resonant magnetic field Hr, as shown in FIG. 4.

In this connection, as is apparent from the equation (8), $v'_p$ is the phase velocity of the electro-magnetic wave which propagates through an isotropic medium having the specific permeability $\mu_{30}$ and the specific permittivity $\epsilon_r$, so that the phase velocity $v_p$ of the magneto-static wave is slower than that $v'_p$ of the electro-magnetic wave in proportion to $R/\lambda_c$, and hence the smaller the radius R of the cylindrical ferri-magnetic body is, the slower the phase velocity of the magneto-static wave is. As a result, the wave length $\lambda$ of the magneto-static wave becomes shorter according to the following equation (9).

$$\lambda = \frac{v_p}{f} \quad (9)$$

On the other hand, as is apparent from FIG. 4, when the intensity $H_{in}$ of the applied DC magnetic field is varied, the specific permeability $|\mu_{+,r}|$ is varied and hence the phase velocity $v'_p$ of the electro-magnetic wave is varied and further the phase velocity $v_p$ of the magneto-static wave is varied. As a result, the wave length $\lambda$ is varied. The sensitivity of this variation of the wave length $\lambda$, which is caused by the variation of the applied magnetic field intensity $H_{in}$, that is, $$\frac{\partial \lambda}{\partial H_{in}}$$

is abruptly increased in the vicinity of the resonant magnetic field intensity $H_r$ in which the variation of the specific permeability $|\mu_+|$ is significant. Accordingly, for increasing the sensitivity of the aforesaid variation of the wavelength, it is required to utilize the vicinity of the resonant magnetic field in which $H_{in} \simeq H_r$ is attained. However, in the vicinity of the resonant magnetic field, even when the applied magnetic field intensity $H_{in}$ is slightly varied for any reason, as is apparent from the above, the wavelength $\lambda$ is varied significantly and hence the instability is caused.

However, when the applied magnetic field intensity $H_{in}$ is kept apart from the resonant magnetic field intensity $H_r$ as far as possible for avoiding the above mentioned unstable operation of the magneto-static wave, the sensitivity $\partial |\mu_+|/\partial H_{in}$ of the variation of the specific permeability is reduced and hence the sensitivity $\partial \lambda/\partial H_{in}$ of the variation of the wavelength is reduced, and, as a result, the sensitivity $\partial \theta/\partial H_{in}$ of the overall phase variation is reduced also. Consequently, it is required to shorten the wavelength $\lambda$ of the magneto-static wave and hence to simultaneously place as many waves as possible on the cylindrical ferri-magnetic body having the length L, so that, as is apparent from the equations (8) and (9), it is required to reduce the radius of the cylindrical ferri-magnetic body as fine as possible.

However, in the case that the radius of the cylindrical ferri-magnetic body is reduced, it is extremely difficult to manufacture it and further the structure thereof becomes fragile. With regard to the frequency modulator employing the cylindrical ferri-magnetic body, which is described in Japanese Patent Publication No. 47-22,050 by the present inventor, these defects on manufacture and practical use have been actually observed. Consequently, the removal of these defects has been conventionally regarded as the task to be accomplished.

SUMMARY OF THE INVENTION

An object of the present invention is to remove the aforesaid conventional defects and to provide a frequency modulator which has a fine structure employing the ferri-magnetic material element and arranged in as small size as possible and which can be stably operated with high sensitivity.

A ferri-magnetic film frequency modulator according to the present invention is featured in that a ferri-magnetic material film deposited on a substrate is provided thereon with an input strip electrode and an output strip electrode which are mutually faced apart from each other, a high frequency electro-magnetic wave being applied thereon through said input strip electrode, a DC magnetic field being applied on said ferri-magnetic material film, a magneto-static wave converted from said high frequency electro-magnetic wave being propagated between said input strip electrode and said output strip electrode, and the wavelength of said magneto-static wave being varied by modulating the intensity of said DC magnetic field with a signal, wherein a high frequency output electro-magnetic wave, which is frequency-modulated by said signal, is derived from said output strip electrode.

So that, according to the present invention, a frequency modulator which is stably operated with the high sensitivity and the excellent linearity under the small-sized and readily manufactured structure can be realized.

BRIEF DESCRIPTION OF THE DRAWINGS

For the better understanding of the invention, reference is made to the accompanying drawings, in which:

FIG. 1 is a block diagram showing a typical conventional frequency modulator as described before;

FIG. 2A is a circuit diagram showing an essential arrangement of another typical conventional frequency modulator as described before;

FIG. 2B is a characteristic diagram showing the manner of operation of the same as described before;

FIG. 3 is a characteristic diagram showing the manner of propagation of a wave through a ferri-magnetic material body as described before;

FIG. 4 is a characteristic diagram showing the manner of variation of the magnetization in the ferri-magnetic material body which is caused by the variation of the applied DC magnetic field as described before;

FIGS. 5A and 5B are a perspective view showing a fundamental structure of an essential portion of a ferri-magnetic film frequency modulator according to the present invention;

FIGS. 6A, 6B and 6C are diagrams showing the manners of generation of a magneto-static wave in a ferri-magnetic material film respectively;

FIG. 7 is a characteristic diagram showing the manner of variation of the phase modulation in response to the wavelength of the magneto-static wave in the ferri-magnetic material body;

FIG. 8 is a characteristic diagram showing the range of variation of the operation in response to the wavelength of the magneto-static wave in the ferri-magnetic material film;

FIG. 9 is a cross-sectional view schematically showing the whole structure of the ferri-magnetic film frequency modulator according to the present invention;

FIG. 10 is a circuit diagram showing an example of an applied magnetic field intensity modulation circuit of the same;

FIG. 11 is a circuit diagram showing another example of the same;

FIGS. 12A and 12B are a cross-sectional view and a diagram schematically showing another example of the whole structure of the same and the manner of operation thereof respectively;

Figure 13:
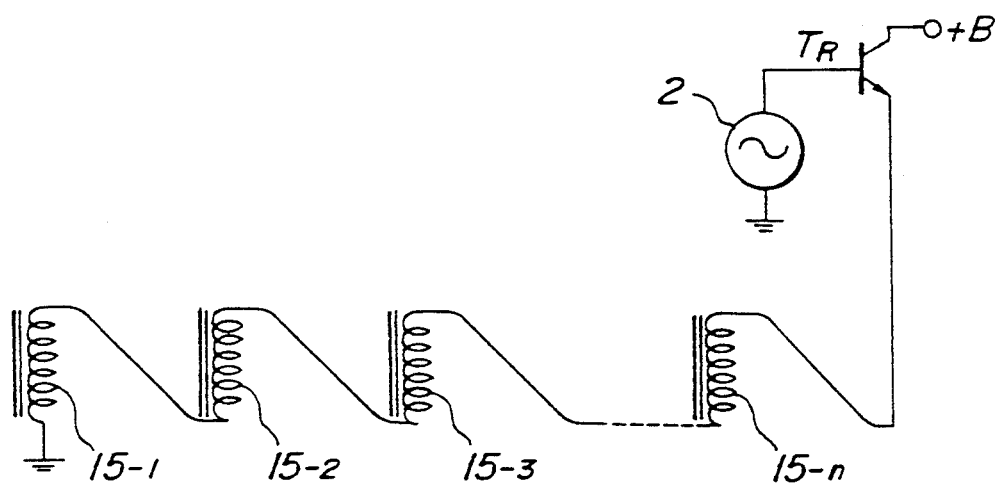
FIG. 13 is a circuit diagram showing another example of the applied magnetic field intensity modulation circuit of the same.

Throughout different views of the drawings, 1 is a voltage controlled oscillator (VCO), 2 is a modulator, 3 is a prescaler, 4 is a reference oscillator, 5 is a comparator, 6 is a low pass filter (LPF), 7 is a dielectric material substrate, 8 is an earth plate, 9, 9a, 9b are input strip electrodes, 10, 10a, 10b are output strip electrodes, 11 is a ferri-magnetic material (YIG) film, 12 is a dielectric material (GGG) substrate, 13 is a magnet plate, 14 is a magnetic circuit, 15 is a coil and 16 is an earthed strip conductor.

DESCRIPTION OF THE PREFERRED EMBODIMENTS

Preferred embodiments of the present invention will be described in detail by referring to accompanying drawings hereinafter.

First, an example of an arrangement for exciting and deriving the magneto-static wave as the basis of the ferri-magnetic film frequency modulator according to the present invention is shown in FIG. 5A. In this basic arrangement, an earth plate 8 is adhered on the rear face of a dielectric material substrate 7, while an input electrode 9 and an output electrode 10, which are formed of strip lines respectively, are arranged on the front face of the substrate 7 opposite to each other with a space therebetween necessary for the propagation of a magneto-static wave. On the other hand, a film 11 of low loss ferri-magnetic material, for example, yttrium-iron-garnet (YIG) is deposited on a substrate 12 of a material having a grating constant which coincides with that of YIG, for example, gadolinium-gallium-garnet (GGG) and is adhered closely to the substrate 7 such as both of those electrodes 9 and 10 are covered thereby. Furthermore, a DC magnetic field, which is perpendicular to the YIG film 11, is applied upon those mutually adhered substrates 7 and 12, for instance, by a magnet (not shown) inserted into a magnetic frame on which a modulating coil is wound, while a necessary high frequency electro-magnetic wave is applied on the input strip electrode 9, so as to generate the magneto-static wave through the YIG film 11 as shown in FIG. 5B. This magneto-static wave is propagated through the YIG film 11 perpendicular to the electrodes 9, 10, and, as a result, a frequency modulated high frequency output electro-magnetic wave, which is converted from the magneto-static wave phase-modulated during the propagation and arriving at the output strip electrode 10, is derived therefrom.

In this connection, the manners of the generation of the magneto-static wave through the YIG film 11 are different from each other in response to the direction of the DC magnetic field applied thereon, as shown in FIGS. 6A, 6B and 6C respectively.

However, in all of these different manners of the generation, the magneto-static wave constitutes a delay line by propagating perpendicular to the input and the output strip electrodes 9 and 10, and the delay time thereof is varied in response to the intensity of the applied DC magnetic field. Consequently, when another magnetic field varied in response to a signal is superposed on the applied DC magnetic field, the phase variation in response to the signal is caused, and, as a result, the reconverted output high frequency electro-magnetic wave is frequency-modulated.

In the situation such that the film of ferri-magnetic material, for example, YIG, which is magnetized by the application of the DC magnetic field, is further applied with the high frequency electro-magnetic wave through the input strip electrode, the magnetic coupling is caused in the ferri-magnetic material film and, as shown in FIGS. 6A, 6B, 6C respectively, precessional circular movements of the top of magnetization are resulted in a plane which is perpendicular to the DC magnetization, the vector m of the circular movement being varied along the propagation direction k of the wave, and the magneto-static wave being generated as a result In a case that the DC magnetic field is applied perpendicular to the YIG film 11, a magneto-static forward volume wave (MSFVW) as shown in FIG. 6B is generated, and in another case that the DC magnetic field is applied parallel to the YIG film 11, when the DC magnetic field is perpendicular to the propagation direction as shown in FIG. 6A, a magneto-static surface wave (MSSW) is generated, and, when the DC magnetic field is applied parallel to the propagation direction k also as shown in FIG. 6C, a magneto-static backward volume wave (MSBVW) is generated.

However, in the magneto-static surface wave (MSSW), as shown in FIG. 6A, the energy is concentrated in the surface of the magnetic film 11, so that, when the power of the electro-magnetic wave applied on the input electrode 9 exceeds 0 dB, harmonic waves are generated according to the nonlinear effect of the ferri-magnetic material On the other hand, in the magneto-static backward volume wave (MSBVW), the DC magnetic field is applied along the propagation direction of the magneto-static wave, so that, for attaining the large phase variation by the variation of the DC magnet field intensity, the propagation path length L of the magnetic material film is required to be elongated, and hence the DC magnetic circuit used for applying the DC magnetic field having the necessary intensity $H_0$ is large-sized. Consequently, for realizing a small sized ferri-magnetic film frequency modulator, it is preferable to employ the magneto-static forward volume wave as shown in FIG. 6B. So that, the ferri-magnetic film frequency modulator according to the present invention will be described hereinafter with regard to the arrangement as shown in FIG. 5 in which the magneto-static forward volume wave (MSFVW) is generated.

First, the relation between the phase $\theta$ of the magneto-static wave and the DC magnetic field intensity $H_{in}$ in the propagation path between the input and the output electrodes 9 and 10 arranged as shown in FIG. 5 will be described. This relation can be obtained according to the dispersion equation which expresses the relation between the angular frequency $\omega$ and the wave number k on the unit length as shown by the following equation (10).

$$\left.\begin{aligned}
\tan \frac{kd}{2\alpha} &= \alpha, \quad \alpha = \frac{1}{\sqrt{-\mu}} \\
\mu &= 1 - \frac{\Omega H}{\Omega^2 - \Omega_H^2} \\
\Omega_H &= \frac{\omega_H}{\omega_M}, \quad \Omega = \frac{\omega}{\omega_M} \\
\omega_H &= |\gamma| H_{in}, \quad \omega_M = |\gamma| M_s
\end{aligned}\right\} \quad (10)$$

where $H_{in}$ is the inner magnetic field intensity in the ferri-magnetic body and Ms is the saturation magnetization The relation between $\Omega$ and kd in the equation (10) can be illustrated by employing $\Omega_H$ as a parameter as shown in FIG. 7, so that it results therefrom that $\Omega$ exists in a range as defined by the following equation (11).

$$\Omega_H < \Omega < \sqrt{\Omega_H(\Omega_H+1)} \quad (11)$$

Consequently, it is required that, when the angular frequency $\omega$ is given, the magnetic field intensity necessitated for generating the magneto-static forward volume wave exists in the range as defined by this equation (11).

By employing the equation (10) and the following relation equation (12) in which L denotes the distance between the input and the output electrodes 9 and 10 in the arrangement as shown in FIG. 5, the phase variation $\delta\theta$ corresponding to the slight variation $\delta H_{in}$ of the inner magnetic field intensity $H_{in}$ can be expressed by the following equation (13).

$$\theta = kL \quad (12)$$

-continued $$\left.\begin{array}{l} \Delta\theta = X_M \cdot \delta H_{in} \\ X_M = -\frac{L}{d} \cdot X_{MO} \\ X_{MO} = \left(\frac{\operatorname{atan}^{-1}\alpha}{\Omega^2 - \Omega_H^2} + \frac{1}{\Omega_H}\right)\frac{\Omega^2(\Omega^2 + \Omega_H^2)}{M_S(\Omega^2 - \Omega_H^2)} \end{array}\right\} \quad (13)$$

So that, the following matters are apparent from this equation (13).

(a) When the DC magnetic field intensity $H_{in}$ is reduced, the phase variation is reduced also.

(b) The sensitivity of the variation of the phase $\theta$ in response to the variation of the DC magnetic field intensity $H_{in}$ is inversely proportional to the thickness d of the YIG film 11 and is proportional to the propagation path length L.

For example, when $\Omega_H = 0.2$, $\Omega = 0.38$, the phase variation $\delta\theta$ is obtained by the following equation (14).

$$\delta\theta = -25,225 \frac{L}{d} \cdot \frac{\delta H_{in}}{M_S} \quad (14)$$

When the thickness $d = 20$ μm of the magnetic material film 11 having the saturation magnetization $M_S = 750$ gauss, the propagation path length L required for obtaining the phase variation $\delta\theta = 30$ radian in response to the inner magnetic field intensity variation $\delta H_{in} = 10$ oersted is as follows from the equation (14).

L = 1.784 mm

Further the following is obtained from the value of $\Omega_H$.

Inner magnetic field intensity:

$H_{in} = 0.2 \times 750 = 150$ (gauss)

External magnetic field intensity:

$H_{ex} = H_{in} + M_S = 150 + 750 = 900$ (gauss)

where, N denotes a diamagnetic field factor, which is 1 in the film.

Furthermore, the following is obtained from the value of $\Omega$.

Angular frequency:

$\omega = |\gamma| M_S \cdot \Omega = 2.8 \times 750 \times 0.38 = 798$ (gauss)

As mentioned above, when the ferri-magnetic material film 11 having the length 1.784 mm, the thickness 20 μm and the saturation magnetization 750 gauss is employed, it can be attained by varying the external magnetic field intensity 900 Oersted in the variation range 10 Oersted that the electro-magnetic wave of the frequency 798 MHz is given with the phase variation 30 radian. As is apparent from the equation (3), this phase variation 30 radian is required for obtaining the frequency modulated wave presenting the frequency deviation 4.5 kHz at the modulation frequency 150 Hz.

Next, as is apparent from the above exemplified numerical values, $\omega_H/\Omega = 0.526$ This numerical value is sufficiently far from the singular point $\Omega = \Omega_H$ in the equation (13). Accordingly, even when the inner magnetic field intensity $H_{in}$ is varied for any reason, for instance, by the variation of the saturation magnetization $M_S$ caused by temperature variation, and hence the operation point is shifted, the operation is sufficiently stable and, as a result, the phase modulation of 30 radian can be attained on thus stable condition of the operation.

Next, when the frequency modulation of the electro-magnetic wave is effected through the above described phase modulation of the magneto-static wave, distortion $K'_2$ and $K'_3$ which are based on the second and the third harmonics respectively can be expressed by the following equation (15).

$$\left.\begin{array}{l} K_2' = \frac{1}{2} \frac{\Delta H_1}{M_S} \cdot \frac{\frac{\partial^2 k}{\partial \Omega_H^2}}{\frac{\partial k}{\partial \Omega_H}} \\ K_3' = \frac{1}{8} \cdot \left(\frac{\Delta H_1}{M_S}\right)^2 \cdot \frac{\frac{\partial^3 k}{\partial \Omega_H^3}}{\frac{\partial k}{\partial \Omega_H}} \end{array}\right\} \quad (15)$$

It is enough to estimate the amount of the distortion by obtaining $\partial k/\partial\Omega_H$, $\partial^2 k/\partial\Omega_H^2$, $\partial^3 k/\partial\Omega_H^3$ in the equation (15) from the equation (10). For example, the distortion $K'_2$ based on the second harmonics, which is thus obtained, can be expressed by the following equation (16).

$$K_2' = \left| \frac{1}{2} \cdot \frac{\Delta H_1}{M_S} \cdot \frac{\Omega_H^2 + \Omega^2}{\Omega^2 - \Omega_H^2} \left[ 3\alpha(\Omega^2 - \Omega_H^2) + 4\alpha^2\Omega_H + \frac{2\alpha^2\Omega_H}{\Omega_H^2 + \Omega^2} - \frac{1}{\Omega_H^2\left(\frac{\operatorname{atan}^{-1}\alpha}{\Omega^2 - \Omega_H^2} + \frac{1}{\Omega_H}\right)} \right] \right| \quad (16)$$

So that, when the above exemplified numerical values, that is, $\Omega_H = 0.2, \quad \Omega = 0.38$ $\Delta H_1 = 10, \quad M_S = 750$ are substituted into the equation (16), the distortion $K_2'$ is as follows.

$K_2' = 0.298\%$

Accordingly, it is apparent that the distortion is extremely little.

Next, the insertion loss $L_s$ caused by effecting the frequency modulation of the electro-magnetic wave through the phase modulation of the magneto-static wave can be expressed by the following equation (17).

$$L_s(dB) = 4.34 \left| \frac{\partial \theta}{\partial H_{in}} \right| \Delta H_{eff} \qquad \qquad (17)$$

$\Delta H$: effective magnetic resonance half width

It is apparent from this equation (17) that the following matters are required for attaining the low insertion loss.

(a) The magnetic resonance half width $\Delta H$ should be reduced as narrow as possible.

Ordinarily, this half width $\Delta H = 0.5$ Oersted can be attained in X-band and the lower the frequency is lowered, the narrower the half width is narrowed. However, it is usual that, below a certain frequency band, if the saturation magnetization $M_S$ cannot be reduced, the half width is increased according to the low magnetic field loss. So that, the above required reduction of the half width $\Delta H$ can be attained according to the low magnetic field loss of the ferri-magnetic material.

On the other hand, when the saturation magnetization $M_S$ is reduced, the Curie point is generally lowered, so that the saturation magnetization $M_S$ is varied in response to the temperature variation and hence the inner magnetic field intensity $H_{in}$ is varied. In other words, when the temperature is raised, the saturation magnetization $M_S$ is reduced, while the factor $\Omega_H$ is increased, and, as a result, the phase modulation sensitivity $\partial \theta / \partial H_{in}$ is varied. Accordingly, it is required to compensate the variation of the phase modulation sensitivity caused by the temperature variation. In this regard, this temperature compensation can be readily achieved through the temperature compensation circuit arranged such that the driving current of the driving element transistor provided for adding the magnetic field component at the modulation frequency to the DC magnetic field is varied in response to the temperature variation.

(b) The factor $\Omega_N$ should be reduced as small as possible.

The value of this factor $\Omega_N$ is varied as shown in FIG. 8 in the range defined by the following equation (18), as is apparent from the equation (11).

$$1 < \Omega_N < \sqrt{1 + \frac{1}{\Omega_N}} \qquad (18)$$

Further, as is apparent from the equation (17), the closer the value of the factor $\Omega_N$ approaches to 1, the lesser the loss is reduced. For example, in a numerical example such as the value $\Delta H = 0.5$ oersted is employed together with $\partial \theta = 30, \partial H_{in} = 10, \Omega = 0.38$ the loss $L_S = 6.51$ (dB) is obtained.

Next, the whole arrangement of the frequency modulator according to the present invention in which the fundamental structure as shown in FIG. 5 is added with a magnetic circuit for applying the DC magnetic field thereon is schematically shown in FIG. 9.

In this whole arrangement, the stacked structure as shown in FIG. 5, which is disposed on a magnet plate 13, is provided in a space of a central pole piece consisting in the added magnetic circuit 14, together with a coil 15 wound thereon for applying a signal-modulating current. The magnet plate 13 is employed for supplying the DC magnetic field forming the dominant component of the magnetic field applied on the ferri-magnetic material film 11. The coil 15 is supplied with the signal current derived from a transistor $T_R$ (FIG. 10) which is driven by the modulation signal derived from the modulator 2, so as to superpose the signal magnetic field upon the DC magnetic field applied on the ferri magnetic material film 11.

Furthermore, for compensating the variation of the modulation sensitivity, which is caused by temperature variation, as mentioned above, a thermistor $R_T$, the resistivity of which is varied in response to the temperature variation, is employed in the base potential setting circuit of the transistor $T_R$ driven by the modulation signal. When the saturation magnetization $M_S$ is reduced in response to the temperature rise, the inner magnetic field intensity $H_{in}$ is increased, because the inner magnetic field intensity $H_{in}$ is the difference between the external magnetic field intensity $H_{ex}$ and the saturation magnetization $M_s$. Consequently, the current derived form the transistor $T_R$ is reduced by increasing the resistivity of the thermistor $R_T$ as shown in FIG. 11 in response to the temperature rise, and hence, the DC magnetic field component, which is superposed on the DC magnetic field according to the magnet plate 13, is reduced by the reduction of the DC current supplied through the coil 15.

Meanwhile, it is generally required for increasing the phase modulation sensitivity $\partial \theta / \partial H_{in}$ of the magneto-static wave frequency modulator to shorten the wave length $\lambda$ thereof. On the other hand, the input and the output strip electrodes 9 and 10 are required to be reduced in size, for instance, the width as short as the wave length $\lambda$ and further to be manufactured with preferable precision. So that, with respect to the manufacture of these strip electrodes provided for coupling the electro-magnetic wave with the magneto-static wave, it is desirable that the wave length $\lambda$ is not so short. Consequently, it is preferable that the wave length $\lambda$ is elongated in the vicinity of the input and the output strip electrodes 9 and 10, while it is shortened in the propagation region of the magneto-static forward volume wave (MSFVW).

In this connection, the elongation of the wave length $\lambda$ of the magneto-static wave corresponds to the reduction of the wave number per unit length of the wave, since $k = 2\pi/\lambda$. So that, as is apparent from the bend between the curved region and the even region, when $\Omega$ is constant, of the characteristic curve as shown in FIG. 7, it is required to increase $\Omega_H$. Consequently, as is apparent from the equation (10), it is further required in the vicinity of those electrodes to increase the inner magnetic field intensity $H_{in}$ in comparison with that of the intermediate region.

By this reason, as schematically shown in FIG. 12A, the space at both end portions of the central pole piece of the magnetic circuit 14 in the whole arrangement as shown in FIG. 9 is narrowed. As a result, as shown in FIG. 12B, the wave length $\lambda$ at both end portions of the magnetic film 11 is elongated by the increased inner magnetic field intensity $H_{in}$ in comparison with that in the intermediate portions thereof.

On the other hand, in the case that the insertion loss $L_S$ of the ferri-magnetic film frequency modulator according to the present invention cannot be neglected, it is preferable that the magneto-static wave propagation path having the length which is enough to attain the necessary frequency modulation is divided into plural stages, each stage of which is arranged as shown in FIG. 9 or FIG. 12A, those stages being successively connected in series through high frequency transistor amplifiers respectively, so as to compensate the insertion loss in each stage. In this connection, for driving each of the modulation coils 15 in each of thus series-connected stages with modulating currents at the same phase, it is preferable to connect all modulation coils 15 in series and to drive those coils 15 through the transistor $T_R$, as shown in FIG. 13.

Figure 14:
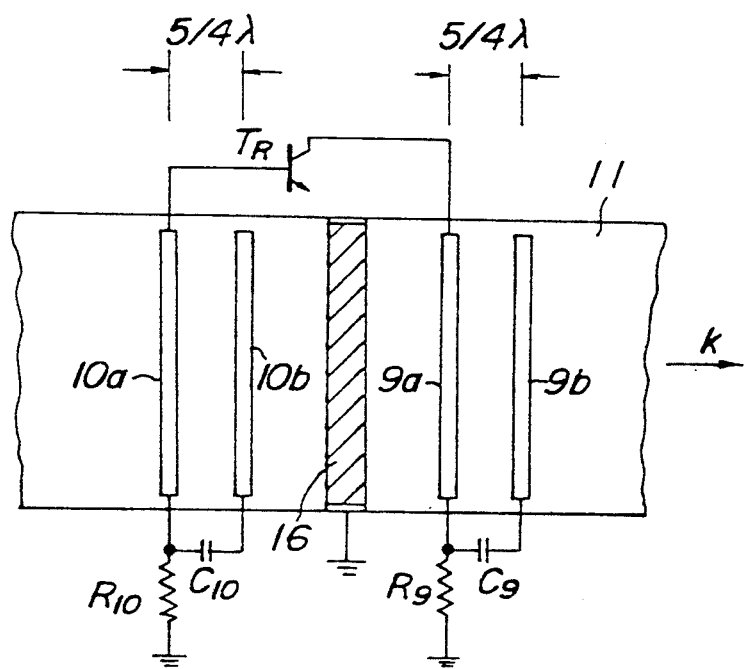
FIG. 14 is a diagram showing another example of input and output strip electrodes of the same.

Furthermore, in the case that thus plural ferri-magnetic film frequency modulating stages are serially arranged on the same ferri-magnetic material film and are successively connected with each other, it is preferable that the input and the output strip electrodes 9 and 10 provided between each stage are arranged respectively in the form of directional electrodes as shown in FIG. 14, so as to prevent any undesired situation such as a disturbing oscillation caused by stray interstage coupling. In this arrangement, strip electrodes 9 and 10 are formed of respective two strip electrodes 9a, 9b and 10a, 10b which are apart from each other by $2n+1/4$ λ and are arranged parallel with each other together with, for instance, interconnecting capacitors $C_9$ and $C_{10}$ respectively, so as to realize a desirable situation such that magneto-static waves, which arrive at output strip electrodes 10a, 10b and leave from input strip electrodes 9a, 9b, are mutually added in the propagation direction and are mutually cancelled in the opposite direction. Furthermore, adjacent output and input strip electrodes 10 and 9 are kept sufficiently far from each other together with earthed strip conductor 16 inserted therebetween, so as to prevent any interstage stray coupling of undesired electro-magnetic waves. In this situation, an interstage high frequency amplifying transistor $T_r$ is connected between near-side strip electrodes 10a and 9a of the input and the output electrodes 10 and 9.

As is apparent from the above, according to the present invention, it is possible to obtain a particularly evident effect such that the frequency modulator provided for modulating the propagation phase of the magneto-static wave in the ferri-magnetic material can be stably operated with good linearity, high sensitivity and low loss by the small sized and readily-manufactured arrangement.

What is claimed is:

1. A ferri-magnetic film frequency modulator in which a ferri-magnetic material film deposited on a substrate is provided thereon with an input strip electrode and an output strip electrode which are mutually faced apart from each other, a high frequency electro-magnetic wave being applied thereon through said input strip electrode, a DC magnetic field being applied on said ferri-magnetic material film, a magneto-static wave converted from said high frequency electro-magnetic wave being propagated between said input strip electrode and said output strip electrode and the wavelength of said magneto-static wave being varied by modulating the intensity of said DC magnetic field with a signal, wherein a high frequency output electro-magnetic wave, which is frequency-modulated by said signal, is derived from said output strip electrode.

2. A ferri-magnetic film frequency modulator as claimed in claim 1, wherein said DC magnetic field is applied perpendicular to said ferri-magnetic material film and perpendicular to said input strip electrode and to said output strip electrode also, so as to form said magneto-static wave of a magneto-static forward volume wave.

3. A ferri-magnetic film frequency modulator as claimed in claim 1 wherein the variation of the frequency modulation effected by said signal in said high frequency electro-magnetic wave, which variation is caused by temperature variation, si compensated by varying a driving current of a modulating element for modulating the intensity of said DC magnetic field by said signal, in response to the temperature variation.

4. A ferri-magnetic film frequency modulator as claimed in claim 1, wherein the intensity of said DC magnetic field applied on the vicinities of said input strip electrode and said output strip electrode provided on said ferri-magnetic material film is larger than the intensity of said DC magnetic field applied on the intermediate region of said ferri-magnetic material film between said input strip electrode and said output strip electrode.

5. A ferri-magnetic film frequency modulator arrangement in which a plurality of ferri-magnetic film frequency modulators as claimed in claim 1 are successively arranged on the same ferri-magnetic material film and are connected in series through amplifying elements respectively, and respective modulating elements for modulating the intensity of said DC magnetic field in each of said plurality of ferri-magnetic film frequency modulators are driven by said signal at the same phase.

6. A ferri-magnetic film frequency modulator arrangement as claimed in claim 5, wherein said output strip electrode and said input strip electrode, which are adjacent to each other between each of said plurality of ferri-magnetic film frequency modulators successively arranged on the same ferri-magnetic material film through said amplifying elements respectively, are apart from each other with an earthed strip conductor inserted herebetween respectively, and each of said strip electrodes is formed of a directional electrode consisting of at least two parallel strips which are given directionality by being arranged apart for each other by $2n+1/4$ wave length and mutually connected through a capacitor or an inductor, so as to reduce the coupling between said output strip electrode and said input strip electrode.

7. A ferri-magnetic film frequency modulator as claimed in claim 2, wherein the variation of the frequency modulation effected by said signal in said high frequency electo-magnetic wave, which variation is caused by temperature variation, is compensated by varying a driving current of a modulating element for modulating the intensity of said DC magnetic field by said signal, in response to the temperature variation.

8. A ferri-magnetic film frequency modulator as claimed in claim 2, wherein the intensity of said DC magnetic field applied on the vicinities of said input strip electrode and said output strip electrode provided on said ferri-magnetic material film is larger than the intensity of said DC magnetic filed applied on the intermediate region of said ferri-magnetic material film between said input strip electrode and said output strip electrode.

9. A ferri-magnetic film frequency modulator as claimed in claim 3, wherein the intensity of said DC magnetic field applied on the vicinities of said input strip electrode and said output strip electrode provided on said ferri-magnetic material film is larger than the intensity of said DC magnetic filed applied on the intermediate region of said ferri-magnetic material film between said input strip electrode and said output strip electrode.

10. A ferri-magnetic film frequency modulator arrangement in which a plurality of ferri-magnetic film frequency modulators as claimed in claim 2 are successively arranged on the same ferri-magnetic material film and are connected in series through amplifying elements respectively, and respective modulating elements for modulating the intensity of said DC magnetic field in each of said plurality of ferri-magnetic film frequency modulators are driven by said signal at the same phase.

11. A ferri-magnetic film frequency modulator arrangement in which a plurality of ferri-magnetic film frequency modulators as claimed in claim 3 are successively arranged on the same ferri-magnetic material film and are connected in series through amplifying elements respectively, and respective modulating elements for modulating the intensity of said DC magnetic filed in each of said plurality of ferri-magnetic film frequency modulators are driven by said signal at the same phase.

12. A ferri-magnetic film frequency modulator arrangement in which a plurality of ferri-magnetic film frequency modulators as claimed in claim 4 are successively arranged on the same ferri-magnetic material film and are connected in series through amplifying elements respectively, and respective modulating elements for modulating the intensity of said DC magnetic filed in each of said plurality of ferri-magnetic film frequency modulators are driven by said signal at the same phase.

* * * * *